(12) United States Patent
Kanai et al.

(10) Patent No.: US 8,174,525 B2
(45) Date of Patent: May 8, 2012

(54) TETRAHEDRAL MESH GENERATING METHOD FOR FINITE-ELEMENT ANALYSIS AND FINITE-ELEMENT ANALYZING SYSTEM USING ITS METHOD

(75) Inventors: Satoshi Kanai, Hokkaido (JP); Hiroaki Date, Hokkaido (JP); Kenji Kishinami, Hokkaido (JP); Ichiro Nishigaki, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 348 days.

(21) Appl. No.: 12/623,903

(22) Filed: Nov. 23, 2009

(65) Prior Publication Data

US 2010/0156903 A1    Jun. 24, 2010

Related U.S. Application Data

(62) Division of application No. 11/214,950, filed on Aug. 31, 2005.

(30) Foreign Application Priority Data

Aug. 31, 2004    (JP) .................. 2004-252933

(51) Int. Cl.
*G06F 17/00* (2006.01)
*G06T 17/00* (2006.01)
(52) U.S. Cl. .................. 345/420; 345/418; 345/419
(58) Field of Classification Search .................. 345/418, 345/419, 420
See application file for complete search history.

(56) References Cited

U.S. PATENT DOCUMENTS

| 5,315,537 | A | 5/1994 | Blacker |
| 5,553,206 | A | 9/1996 | Meshkat |
| 5,617,322 | A | 4/1997 | Yokota |
| 5,731,817 | A | 3/1998 | Hahs et al. |
| 5,760,779 | A | 6/1998 | Yamashita et al. |
| 5,768,156 | A | 6/1998 | Tautges et al. |
| 5,774,124 | A | 6/1998 | Itoh et al. |
| 5,774,696 | A | 6/1998 | Akiyama |
| 5,819,070 | A | 10/1998 | Sasaki |
| 5,929,860 | A * | 7/1999 | Hoppe .......................... 345/419 |
| 6,236,738 | B1 | 5/2001 | Zhu et al. |
| 6,252,601 | B1 | 6/2001 | Tanaka |
| 6,573,892 | B1 | 6/2003 | Yang et al. |
| 6,630,932 | B1 | 10/2003 | Grzeszczuk |
| 6,718,290 | B1 * | 4/2004 | Szymczak et al. ................ 703/2 |
| 2005/0143965 | A1 | 6/2005 | Failla et al. |

FOREIGN PATENT DOCUMENTS

JP    2003-132099    5/2003

OTHER PUBLICATIONS

Hiroaki Date et al., "Saibunka to Kanryakuka ni motoduku Mesh Hinshitu Kojo Shuho", Proceedings of a Hokkaido Branch of JSPE 2003 Meeting, The Japan Society for Precision Engineering, Sep. 6, 2003, pp. 41-42.

* cited by examiner

*Primary Examiner* — Amare Mengistu
*Assistant Examiner* — Aaron M Guertin
(74) *Attorney, Agent, or Firm* — Antonelli, Terry, Stout & Kraus, LLP.

(57) ABSTRACT

A tetrahedral mesh generating method for finite-element analysis executable by a computer, using edge collapse and quality conserve arrangements.

4 Claims, 6 Drawing Sheets

| | (a) RIDGE LINE USING Half EC | (b) NON-EFFECTIVE RIDGE LINE |
|---|---|---|
| RIDGE LINE ON SHAPE SURFACE | (2, 3, *)  •―○  i    j<br><br>(2, 1, 1)  •―○  i    j | (2, 2, *)  •―•  i    j<br><br>(2, 1, 2)  •―○  i    j<br><br>(1, 1, 2)  ○―○  i    j<br><br>(a,b,c)<br>a,b=1: (i,j) ON ACS RIDGE LINE<br>a,b=2: (i,j) AT ACS VERTEXES OR END POINTS ON ACS RIDGE LINE<br>a,b=3: (i,j) AT NORMAL VERTEXES<br>c=1: (i,j) ON ACS RIDGE LINE<br>c=2: (i,j) ON NORMAL RIDGE LINE |
| INNER RIDGE-LINE | (1, 2)  •―○  i    j | (1, 1)  •―•  i    j<br><br>(a,b)<br>a,b=1: (i,j) ON SHAPE SURFACE<br>a,b=2: (i,j) INSIDE SHAPE |

FIG. 6

(a) HIGH-DENSITY MESH
(b) LOW-RESOLUTION MESH 1
(c) LOW-RESOLUTION MESH 2

FIG. 7

ESTIMATING RESULT OF MESH CHARACTERISTIC

| MESH | NUMBER OF ELEMENTS | ELEMENT SIZE | | STRETCH | | NUMBER OF VERTEXES |
|---|---|---|---|---|---|---|
| | | MAX* | AVE | MIN* | AVE | MAX* |
| FIG. 6B | 183,003 | 9.94 (10) | 5.34 | 0.20 (0.2) | 0.61 | 25 (25) |
| FIG. 6C | 6,003 | 9.99 (10) | 7.77 | 0.21 (0.2) | 0.61 | 21 (25) |

*VALUE OF DESIGNATED CHARACTERISTIC CONTROL PARAMETER

FIG. 8

(a) HIGH-DENSITY MESH (b) LOW-RESOLUTION MESH

TETRAHEDRAL MESH GENERATING METHOD FOR FINITE-ELEMENT ANALYSIS AND FINITE-ELEMENT ANALYZING SYSTEM USING ITS METHOD

CROSS REFERENCE TO RELATED APPLICATION

This is a divisional of U.S. application Ser. No. 11/214,950, filed Aug. 31, 2005. This application relates to and claims priority from Japanese Patent Application No. 2004-252933, filed on Aug. 31, 2004. The entirety of the contents and subject matter of all of the above is incorporated herein by reference.

BACKGROUND OF THE INVENTION

1. Field of the Invention

The present invention relates to a tetrahedral mesh generating method for finite-element analysis and a finite-element analyzing system using the method. More particularly, the present invention relates to a technology for automatically generating Multi-Resolution Representation (hereinafter, referred to as MRR) for analysis from a tetrahedral mesh with high quality suitable for analysis by using a computer.

2. Description of the Related Art

Upon analyzing the physical characteristics of a material, such as the strength and the thermal degeneration with a Finite-Element Method (hereinafter, referred to as FEM), a mesh model is used to express a solid model of the material for Computer Graphics (hereinafter, referred to as CG), as a set of meshes.

Conventionally, the mesh of solid model is generated typically by FEM mesher which generates a tetrahedral mesh with high quality.

Further, Non-Patent Documents 1 and 2 disclose well-known mesh model generating methods.

[Non-Patent Document 1] Oliver G. Staadt and Markus H. Gross: Progressive Tetra-hedralizations, proc. of IEEE Visualization 98, pp. 397-402, in 1998.

[Non-Patent Document 2] H. Garland and Paul. S. Heckbert: Surface Simplification Using Quadric Error Metric, proc. of SIGRAPH 97, pp. 209-216, in 1997

At the earliest possible time of product development, it is requested that the product shape is determined by the Finite-Element Analysis (hereinafter, referred to as FEA). In order to satisfy the request, the efficiency of Computer-Aided Engineering (hereinafter, referred to as CAE) and the FEA requires the generation of mesh with high quality. Further, the automatic generation of mesh for analysis is required with high strength and high controllability.

However, the automatic generation of mesh for FEA must be improved in automatic generation of mesh with low resolution for complicated solid shape and characteristic control of flexible mesh. Here, the high-quality mesh indicates the small distortion of mesh and the high uniformity of mesh size. Further, the strong mesh-generating method for analysis means the stable mesh-generating-processing, and requires fast processing for generating the mesh with desired quality. Furthermore, the high characteristic-controllability means that the mesh with quality suitable for analysis is freely operated.

SUMMARY OF THE INVENTION

It is an object of the present invention to establish an automatic generating method of a tetrahedral mesh for analysis from high-density tetrahedron with characteristics suitable for analysis.

In order to solve the problem, according to the present invention, basically, the mesh for analysis with characteristics suitable for analysis is automatically generated from a tetrahedral mesh with high density which is stably generated by the FEM mesher by a simplifying method and the MRR. Here, the MRR keeps information which is lost in the simplification, and holds the information and the coarsest mesh. In particular, the characteristic (quality) necessary for mesh for FEA is controllable by a parameter or the like, and the element for setting an analyzing condition with simplification of mesh is stored in the mesh after simplification.

Specifically, according to the present invention, a tetrahedral mesh generating method for finite-element analysis executable by a computer, comprises: a first step of adding an identification sign to an element, to which an analyzing condition of a solid model of a product is set, and of generating a tetrahedral mesh of the product; and a second step of performing simplification for storing the element for setting the analyzing condition and reducing the number of tetrahedral meshes generated by the first step and generating the tetrahedral mesh for finite-element analysis.

In this case, the tetrahedral mesh generating method for finite-element analysis further comprises: a third step of executing the finite-element analysis based on the analyzing condition set as the tetrahedral mesh for finite-element analysis generated by the second step. The second step calculates a new vertex for integrating vertexes at both end points of a ridge line forming the tetrahedral mesh to one, and performs the simplification based on the calculated new vertex. The processing for calculating the new vertex executes the processing while storing the mesh element to which the analyzing condition is set. The processing for calculating the new vertex does not execute the simplification, when the ridge line is a ridge line to which the analyzing condition is set or when the end point of the ridge line is a vertex or end point to which the analyzing condition is set.

The simplification in the second step reduces the number of the meshes under a condition to satisfy a parameter for controlling the characteristics of mesh which is preset, and the tetrahedral mesh generating method for finite-element analysis further comprises: a fourth step of correcting the parameter based on an analyzing result executed by the third step. The simplification in the second step reduces the number of the meshes under a condition to satisfy a parameter for controlling the characteristics of mesh which is preset, and the tetrahedral mesh generating method for finite-element analysis further comprises: a fourth step of correcting the parameter based on an analyzing result executed by the third step. The simplification in the second step reduces the number of the meshes under a condition to satisfy a parameter for controlling the characteristics of mesh which is preset, and the tetrahedral mesh generating method for finite-element analysis further comprises: a fourth step of correcting the parameter based on an analyzing result executed by the third step. The parameter for controlling the characteristics of mesh is at least one of a lower limit $\tau_{ST}$ of the quality of element shape, an upper limit $\tau_{SZ}$ of the size, an upper limit $\tau_{SL}$ of an approximation error for shape, and an upper limit $\tau_{VL}$ for vertex estimation.

Further, according to the present invention, a finite-element analyzing system executable by a computer, comprises: an analyzing-condition setting unit that captures data on a solid model of a product and sets an analyzing condition; a tetrahedral mesh generating unit that captures the analyzing condition and the solid model and adds an identification sign to an element, to which the analyzing condition is set, based on at least a setting element size, to generate a tetrahedral mesh; a multi-resolution tetrahedral mesh generating unit that captures the tetrahedral mesh which is generated by the tetrahedral mesh generating unit and additionally has the identification sign and generates the tetrahedral mesh for analyzing with low density; and a finite-element analyzing unit that captures the tetrahedral mesh of multi-resolution for controlling the resolution generated by the multi-resolution tetrahedral mesh generating unit and performs the finite-element analysis by using the analyzing condition.

In this case, the finite-element analyzing system according to claim 10 further comprises: a parameter changing unit that changes said characteristic control parameter of the mesh based on the analyzing result of said finite-element analyzing unit.

According to the present invention, it is possible to automatically generate the tetrahedral mesh from the tetrahedral mesh with high density suitable for analysis.

DESCRIPTION OF THE PREFERRED EMBODIMENTS

Figure 1:
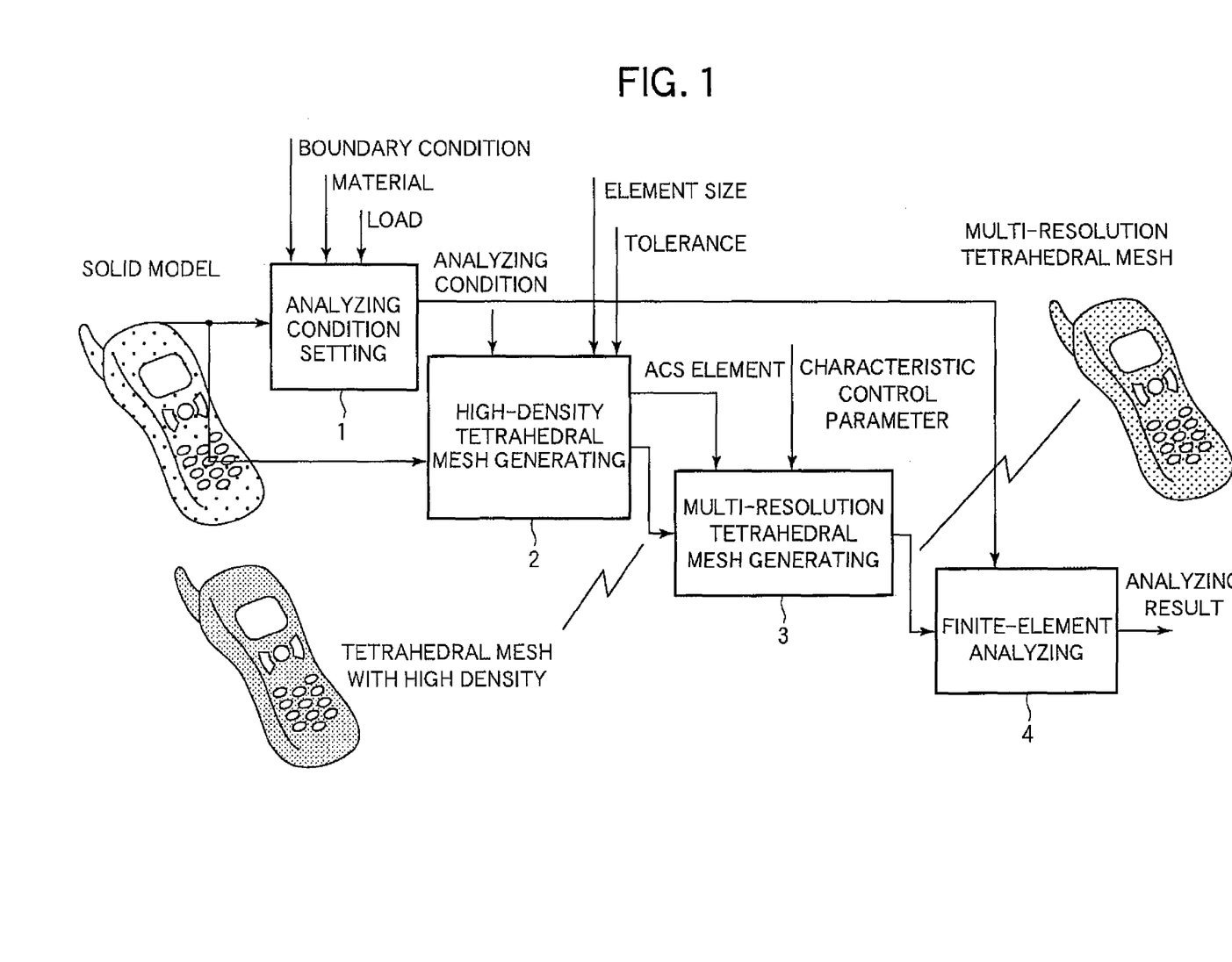
FIG. 1 is a diagram showing the structure of a CAE system using a generating method of a tetrahedral mesh for FEA according to an embodiment of the present invention.

Hereinbelow, a description is given of an embodiment according to the present invention. FIG. 1 is a diagram showing the structure of a CAE system using a generating method of a tetrahedral mesh for FEA according to an embodiment of the present invention. Referring to FIG. 1, according to the present invention, the CAE system comprises: an analyzing-condition setting unit 1; a high-density tetrahedral mesh generating unit 2; and a multi-resolution tetrahedral mesh generating unit 3; and a finite-element analyzing unit 4. The units control, by a parameter or the like, the characteristics (quality) necessary for a computer and a computer program. If the mesh is simplified, the element for setting the analyzing condition is stored in the mesh after simplification.

The analyzing-condition setting unit 1 captures data on a solid model of a product, generated by Computer-Aided Design (hereinafter, referred to as CAD), and sets, to the solid model, analyzing conditions including a material, load, and limiting conditions and boundary condition to be inputted.

The high-density tetrahedral mesh generating unit 2 uses the well-known FEM mesher, captures the data on the solid model and the analyzing conditions, and generates the tetrahedral mesh with high density based on the element size to be inputted and set and the tolerance (upper limit of approximation error for shape). In this case, the tetrahedral mesh with a label of ID sign is generated to the element used for setting the analyzing condition (hereinafter, referred to as an element for setting the analyzing condition).

The multi-resolution tetrahedral mesh generating unit 3 is the feature of the present invention, and captures the data on the tetrahedral mesh with high density generated by the high-density tetrahedral mesh generating unit 2 and characteristic control parameters of the element for setting the analyzing condition and the mesh to be inputted and set and automatically generates the analyzing mesh. According to the embodiment, the mesh is simplified by reducing the number of meshes and the analyzing mesh with the characteristics suitable for analysis is generated by the MRR. As will be described later, the multi-resolution tetrahedral mesh generating unit 3 flexibly controls the characteristics of mesh while certainly storing the element for setting the analyzing condition which has even complicated shape and is necessary for generation of analyzing condition.

The finite-element analyzing unit 4 captures the tetrahedral mesh with multi-resolution which is generated by the multi-resolution tetrahedral mesh generating unit 3 and controls the resolution, analyzes the finite element by the analyzing condition set by the analyzing-condition setting unit 1, and estimates the shape of product design.

Hereinbelow, a detailed description is given of the multi-resolution tetrahedral mesh generating unit 3, serving as the feature of the present invention.

[1] Control of Mesh Characteristics

First, the finite-element analysis needs the proper mesh characteristics in view of the reduction in analyzing time and the improvement in precision. According to the embodiment, of the mesh characteristics, the quality of element shape, size, approximation error for shape, and the number of vertexes (nodes) are considered. That is, as mesh-characteristic control parameters designated by a user, a lower limit $\tau_{ST}$ of the quality of element shape, an upper limit $\tau_{SZ}$ of size, an upper limit $\tau_{TL}$ of an approximation error for shape, an upper limit $\tau_{VL}$ for vertex estimation are inputted and set, thereby controlling the mesh characteristics.

Although not shown, the mesh-characteristic control parameters are changed based on the FEA if necessary and are fed-back to the multi-resolution tetrahedral mesh generating unit 3, thereby repeating the mesh simplification processing. As mentioned above, preferably, the analyzing mesh with the characteristics suitable for analysis is generated.

[2] Storage of Element for Setting Analyzing Condition

Figure 2:
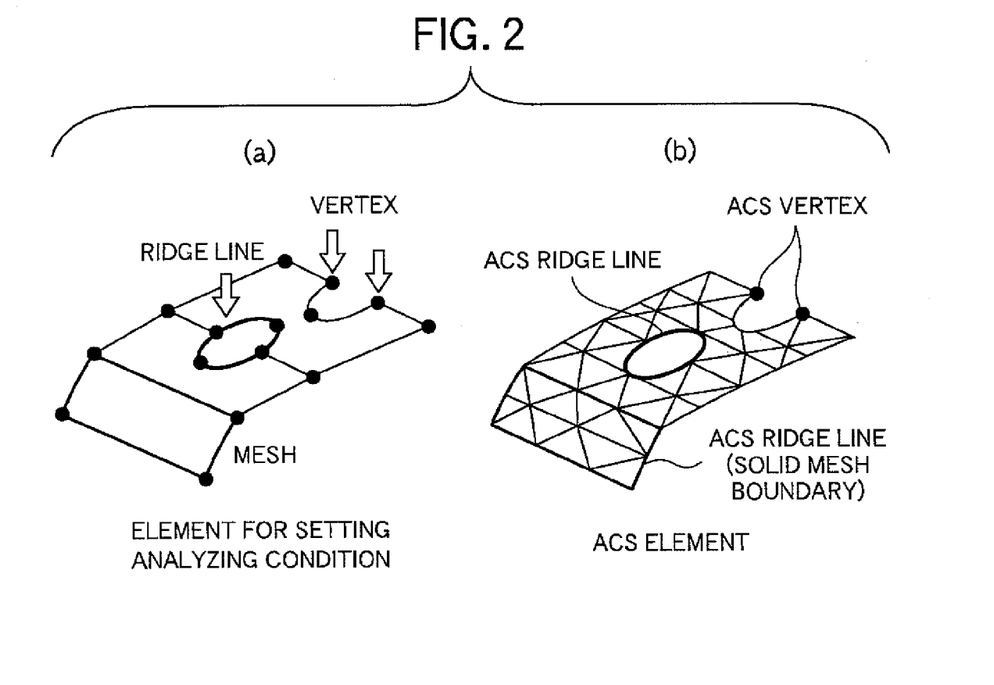
FIGS. 2A and 2B are conceptual diagrams for explaining the storage of an ACS element on the mesh corresponding to a solid element to which an analyzing condition is set and the generation of tetrahedral mesh.

The mesh element corresponding to the solid element (in FIG. 2A), to which the analyzing-condition setting unit 1 sets the analyzing condition on the shape surface of the solid model, must exist on the analyzing mesh. According to the embodiment, the high-density tetrahedral mesh generating unit 2 adds a label to the element for setting the analyzing condition and generates the tetrahedral mesh therewith. That is, an Analyzing Condition Setting (hereinafter, referred to as ACS) element is determined to the mesh. In the processing for simplifying the mesh by the multi-resolution tetrahedral mesh generating unit 3, the ACS element is stored, thereby remaining the element necessary for setting the analyzing condition on the mesh with low resolution. For example, referring to FIG. 2B, an ACS vertex is determined to the solid vertex of analyzing condition, and an ACS ridge line is determined to the ridge line and the mesh.

[3] Simplification of Tetrahedral Mesh

Since the tetrahedral mesh generated by the high-density tetrahedral mesh generating unit 2 by using the FEM mesher has high density, it is well-known that the degree of freedom for mesh operation is high. As the feature according to the embodiment, the tetrahedral mesh with high density is simplified by using the high degree of freedom in consideration of the quality, thereby generating the tetrahedral mesh suitable for the analysis.

Figure 3:
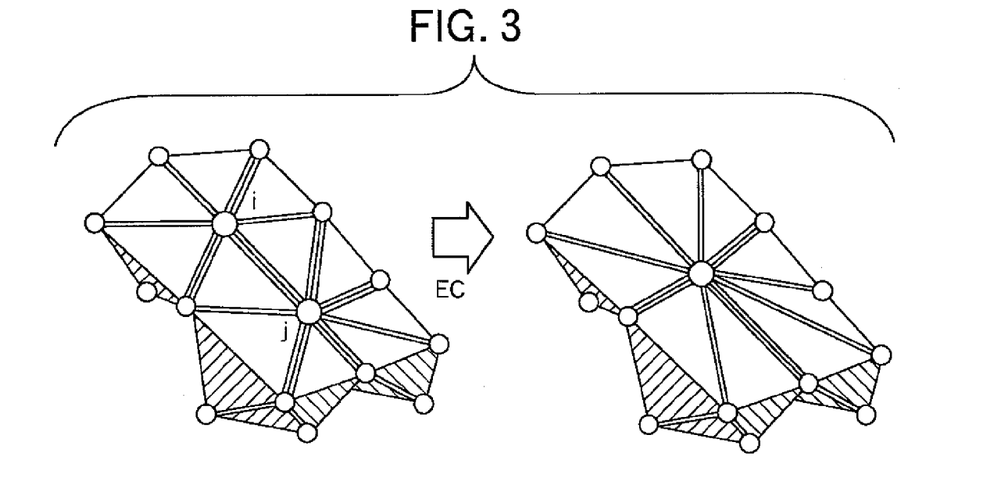
FIG. 3 is a conceptual diagram for explaining an example of EC processing for simplifying the tetrahedral mesh.
Figure 4:
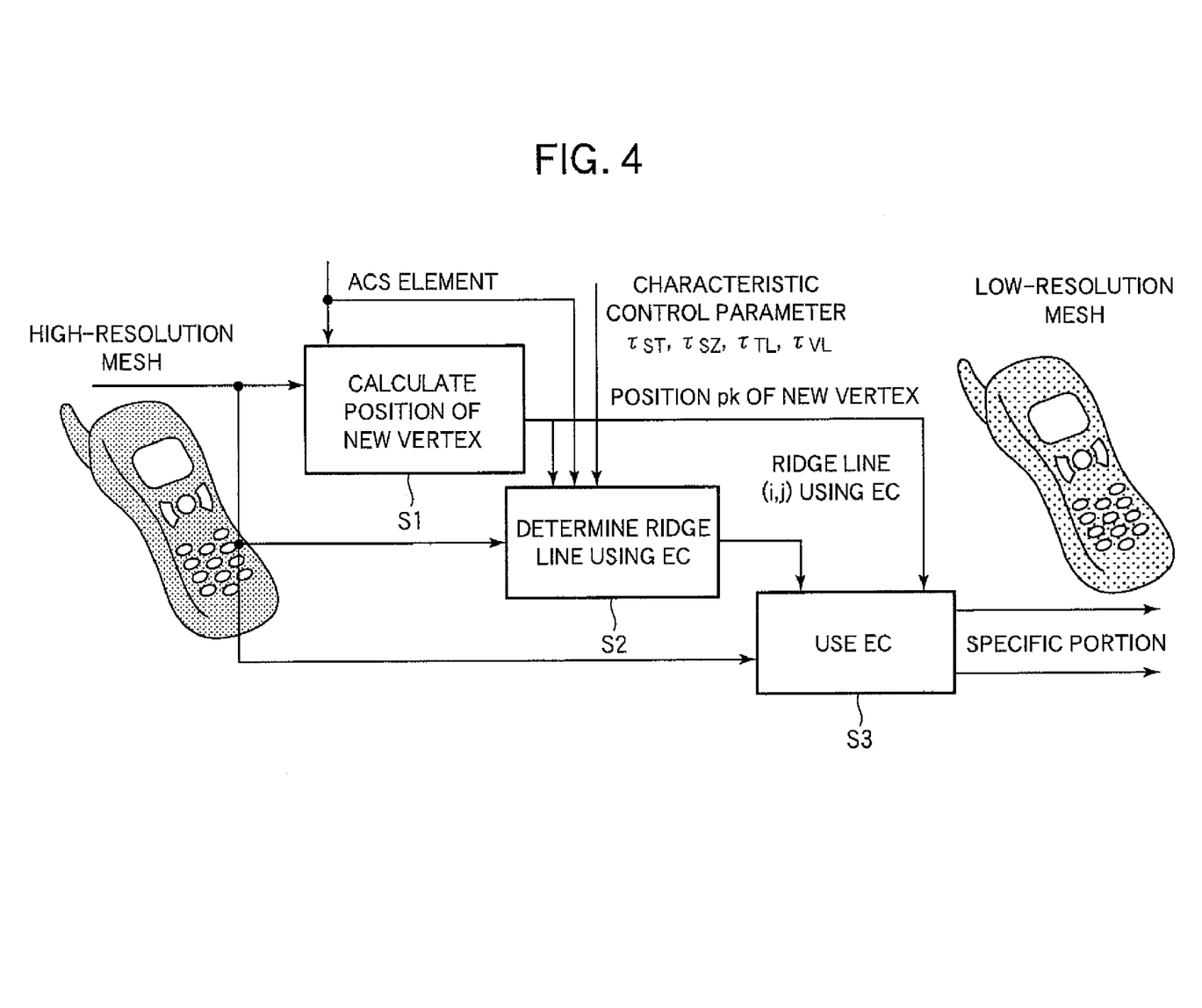
FIG. 4 is a block diagram showing the processing sequence of simplifying the tetrahedral mesh.

Referring to FIG. 3, the tetrahedral mesh is simplified by integrating vertexes i and j at both end points of a ridge line forming the tetrahedral mesh to one new vertex k. This processing is well-known as Edge Collapse (hereinafter, referred to as EC) processing (refer to Non-Patent Document 1). Referring to FIG. 4, in the mesh simplification processing, the processing in steps S1 to S3 is iterated.

(S1: Calculate New Vertex)

In step S1, the data on the mesh with high resolution and the data on the ACS element are captured from the high-density tetrahedral mesh generating unit 2, and the positions of vertexes for all ridge line after the EC processing are calculated. The processing is subjected to the ridge line changed by the EC processing in step S3. That is, the two vertexes i and j forming the ridge line are integrated to one new vertex k. The EC processing is disclosed in, e.g., Oliver G. Staadt and Markus H. Gross: Progressive Tetrahedralizations, proof. Of IEEE Visualization 98, pp. 379-402, in 1998.

(S2: Determine Ridge Line Using EC Processing)

In step S2, the position of a new vertex calculated in step S1, the mesh with high resolution and ACS element generated by the endoscope, and the characteristic control parameters $\tau_{ST}$, $\tau_{SZ}$, $\tau_{TL}$, and $\tau_{VL}$ are captured, and it is estimated whether or not the EC processing is used for all ridge lines including the ridge line changed by using the EC processing. Then, the ridge line which is determined that the EC processing is used is set as an effective ridge-line. Further, an estimated value of the degree of quality storage of the effective ridge-line is determined. When the effective ridge-line does not exist, the processing ends.

(S3: Use EC)

In step S3, the mesh is simplified by the EC processing by using the ridge line (i,j) having the maximum estimated value obtained in step S2, the mesh with high resolution generated by the high-density tetrahedral mesh generating unit 2, and a position $p_k$ of the new vertex determined in step S1. Then, the processing returns to step S1. Steps S1 to S3 are iterated as mentioned, thereby simplifying the mesh with high resolution, generating the mesh with low resolution suitable for analysis, and outputting the resultant mesh to the finite-element analyzing unit 4.

[4] Mesh Estimating Method

A detailed description is given of an estimating method of the mesh having the degree of quality storage using the EC processing in step S2. According to the embodiment, the mesh is estimated based on an approximation error for shape, element size, and element shape.

[4.1] Approximation Error for Shape

An error $d_{ij}(k)$ caused by the processing of [EC (i,j)→k] for integrating the two vertexes i and j to one new vertex k is estimated for the approximation error for shape, by the squared distance of the vertex k to the surface mesh for shape (refer to Non-Patent Document 2). Further, the squared distance of the vertex k to the ridge line forming the ACS ridge line is estimated for the ACS ridge line.

The error $d_{ij}(k)$ is defined by the following formula (1).

[Formula 1]

$$d_{ij}(k) = p_k^T(A_i + A_j)p_k + 2(B_i + B_j)p_k + C_i + C_j \quad (1),$$

where $$A_i = \sum_{f \in \hat{f}^*(i)} n_f n_f^T + \sum_{e \in \hat{e}^*(i)} \begin{pmatrix} 1 - d_{ex}^2 & -d_{ex}d_{ey} & -d_{ex}d_{ez} \\ -d_{ex}d_{ey} & 1 - d_{ey}^2 & -d_{ey}d_{ez} \\ -d_{ex}d_{ez} & -d_{ey}d_{ez} & 1 - d_{ez}^2 \end{pmatrix}$$

$$B_i = -\sum_{f \in \hat{f}^*(i)} (n_f^T p_i) n_f^T + \sum_{e \in \hat{e}^*(i)} \left(-p_i + (d_e^T p_i)^2 d_e\right)^T$$

$$C_i = \sum_{f \in \hat{f}^*(i)} (n_f^T p_i)^2 + \sum_{e \in \hat{e}^*(i)} \left(p_i^T p_i + (d_e^T p_i)^2\right)$$

$p_i$: $(x_i, y_i, z_i)^T$ (=coordinate value of vertex i),
$n_f$: Unit normal of mesh f,
$d_e$: $(d_{ex}, d_{ey}, d_{ez})^T$ (=unit directional vector of ridge line e forming ACS ridge line),
$\hat{f}^*(i)$: Set of meshes on the shape surface connected to vertex i, and
$\hat{e}^*(i)$: Set of ridge lines forming ACS ridge line connected to vertex i.

[4.2] Element Size

The element size is defined, as a length $S_z(h)$ of the longest side of a tetrahedral element h expressed by the following formula (2) using a length $l_e$ of a ridge line e.

[Formula 2]

$$S_z(h) = \max_{e \in h} l_e \quad (2)$$

[4.3] Element Shape

The quality of element shape is estimated by a stretch $S_t(h)$ in the following (3) which is frequently used in the FEA.

[Formula 3]

$$S_t(h) = 6\sqrt{6} V_h / (\max_{e \in h} l_e \times S_h) \quad (3),$$

where reference symbols $V_h$ and $S_h$ denote the volume and the surface area of a tetrahedral element h, respectively, and reference symbol $l_e$ denotes the length of the ridge line e. The stretch $S_t(h)$ is equal to one in the case of regular tetrahedron, and is close to zero as the element shape is more distorted. Preferably, the mesh having the stretch $S_t(h)$ of 0.05 or more is used for analysis.

[5] Calculation of New Vertex After EC Processing

Figure 5:
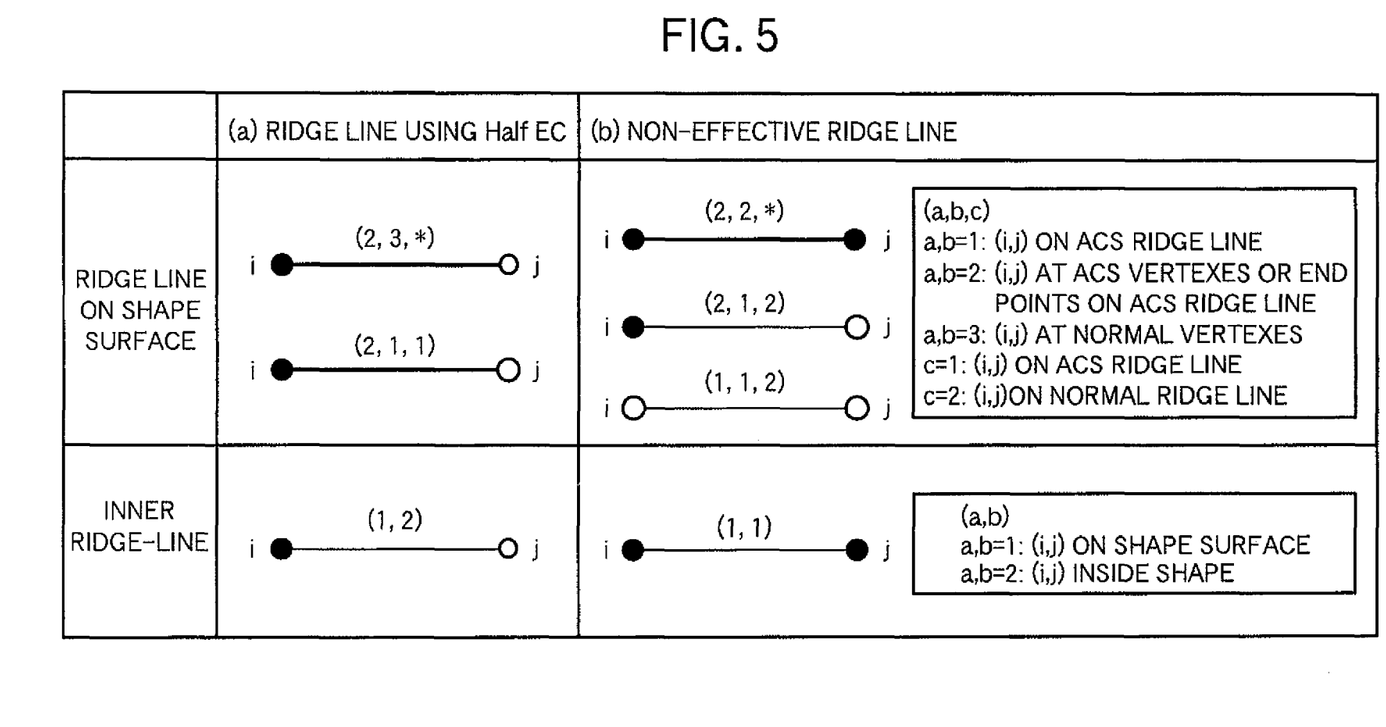
FIG. 5 is a diagram showing the concept of using the EC processing for type of ridge lines in the simplification.

FIG. 5 shows examples of labels for identifying the vertex and the ridge line. The upper row in FIG. 5 shows the ridge line on the shape surface, and the lower row in FIG. 5 shows the inner ridge-line. The left column (a) in FIG. 5 shows the ridge line using Half-EC. The right column (b) in FIG. 5 shows the non-effective ridge-line. Referring to FIG. 5, with respect to the ridge line on the shape surface, labels (a,b,c) are added to the ridge lines (i,j) on the shape surface in the upper row. In the case of [a,b=1], the ridge line (i,j) exists on the ACS ridge line. In the case of [a,b=2], the ridge line (i,j) has the ACS vertexes or end points on the ACS ridge line. In the case of [a,b=3], the ridge line (i,j) has normal vertexes. In the case of [c=1], the ridge line (i,j) exists on the ACS ridge line. In the case of [c=2], the ridge line (i,j) is a normal one. With respect to the inner ridge-line in the lower row, the labels (a,b) are added. In the case of [a,b=1], the ridge line (i, j) exists on the shape surface. In the case of [a,b=2], the ridge line (i,j) exists inside the shape. Incidentally, reference symbol "*" in FIG. 5 denotes 1 or 2.

In order to store the shape and ACS element, with respect to the position $p_k$ of the new vertex k after the EC processing of the ridge line e, that is, ridge line (i, j), the position $p_k$ is identical to the position $p_i$ for the specific ridge line shown in the left column (a) in FIG. 5. That is, upon integrating the pair of the vertexes to one, a Half-EC (Edge Collapse) method for using one of the pair of vertexes as a new position is used. Further, when the ridge line is a non-effective ridge line, the EC processing is not used for the non-effective ridge line. In another case, the vertex is set as one adjacent vertex between the vertexes i and j for keeping the quality by a partial mesh after the EC processing, that is, the gravity center of the set of adjacent vertexes. In the set of adjacent vertexes, for the ridge line on the shape surface, the set of only vertexes on the surface is used. Further, for the ridge line on the shape surface, a position $[p_k = -(A_i + A_j)^{-1}(B_i + B_j)]$ of a vertex for minimizing the squared distance of the mesh in contact with the ridge line (i,j) to the ACS ridge line is set as a second candidate, and is sequentially used in accordance with an estimating result as will be described hereinbelow.

[6] Determination of Ridge Line for EC Processing

[6.1] Extraction of Effective Ridge-Line

According to the embodiment, in order to guarantee the mesh quality, the ridge line for satisfying the following conditions is extracted as an effective ridge-line for EC processing.

Condition A: Guarantee the upper limit of approximation error of ACS ridge line:

$$d_{ij}(k) \leq \tau_{TL}$$

Condition B: Guarantee the quality of element shape:

$$\forall_h \in h^*(k); S_t(h) \geq \tau_{ST}$$

Condition C: Guarantee the upper limit of element size:

$$\forall_h \in h^*(k); S_z(h) \leq \tau_{SZ}$$

Condition D: Guarantee the upper limit of number of vertexes:

$$|v^*(i)| + |v^*(j)| - |f^*(i) \cap f^*(j)| - 2 \leq \tau_{VL},$$

where reference symbol h*(i) denotes a set of tetrahedral elements connected to the vertex i, reference symbol f*(i) denotes a set of meshes connected to the vertex i, and reference symbol v*(i) denotes a set of vertexes connected to the vertex i. Under Conditions A to D, the ridge line on the shape surface is estimated. Under Conditions B to D, the ridge line inside the shape is estimated. Further, in order to store the ACS element and prevent the generation of non-manifold, the ridge line shown in the right column (b) in FIG. 5 is determined as a non-effective ridge line. The non-effective ridge-line is not subjected to the EC processing.

[6.2] Calculation of Estimated Value of Ridge Line

Importantly, the high quality of element shape is stored even in the use of EC processing, and the element size is uniformized. Then, of the ridge lines determined as the effective ridge-lines for EC processing, the EC processing is preferentially used for the ridge lines having a larger stretch near the mesh after integration using the simplification and having a shorter length of the element side there near. An estimated value $\epsilon_{ij}$ for ridge line (i,j) is determined by the following formula (4). Then, the EC processing is performed to the ridge lines, starting from those having the larger estimated value $\epsilon_{ij}$.

[Formula 4]

$$\varepsilon_{ij} = \frac{|h^*(i) \cup h^*(j)|}{|h^*(k)|} \min_{h \in h^*(k)} St(h) \times \sum_{h \in h^*(k)} St(h) \Big/ \sum_{h \in h^*(i) \cup h^*(j)} \min_{e \in h} l_e \quad (4)$$

Figure 6:
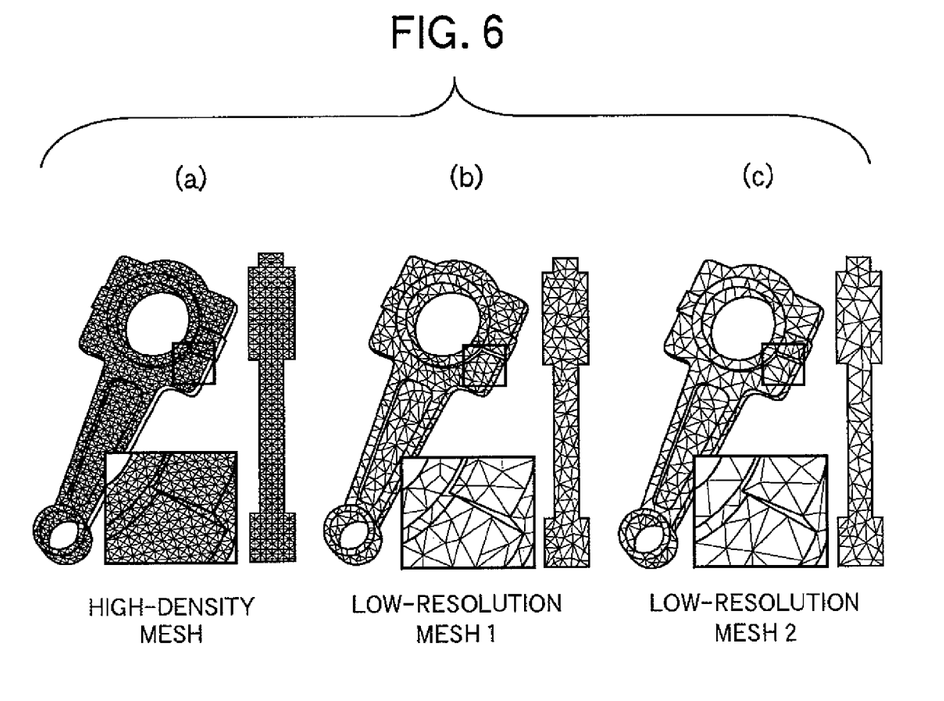
FIGS. 6A to 6C are diagrams showing low-resolution meshes having different numbers of elements for tetrahedral mesh with high quality according to the embodiment.
Figure 7:
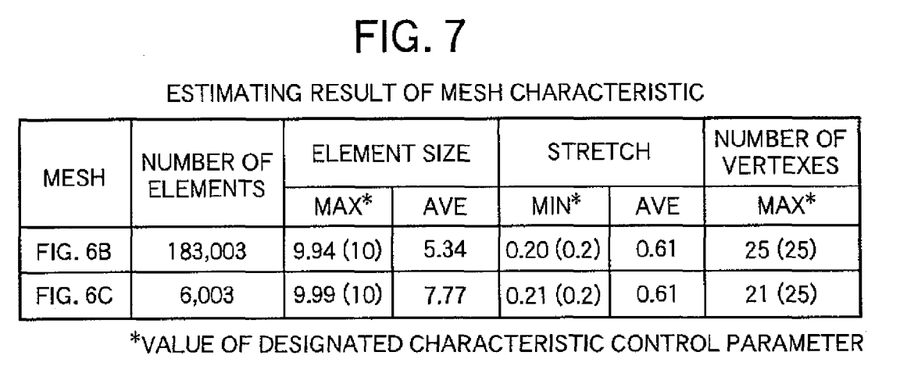
FIG. 7 is a diagram showing estimating results of meshes shown in FIGS. 6B and 6C.

FIGS. 6A to 6C are diagrams showing one change in mesh of a product according to the embodiment. According to the embodiment, for the tetrahedral mesh with high density (the number of elements is 157,083) shown in FIG. 6A, meshes 1 and 2 with low resolution having different numbers of elements are obtained as shown in FIGS. 6B and 6C. FIG. 7 shows estimating results of the meshes. Referring to FIG. 7, according to the present invention, the mesh is generated to satisfy the characteristic control parameter, and the mesh characteristics are easily controlled by changing the mesh characteristic control parameters.

Figure 8:
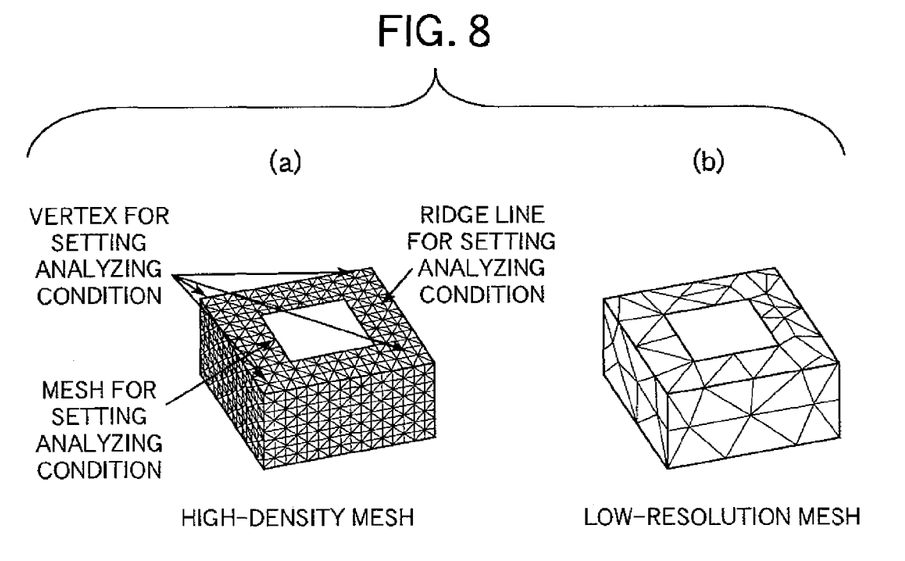
FIGS. 8A and 8B are diagrams showing the storage of vertex necessary for setting the analyzing condition, ridge line, and mesh shape on the mesh with low resolution according to the embodiment of the present invention.

FIGS. 8A and 8B are diagrams showing another change in mesh of the product according to the embodiment. According to the embodiment, for the mesh with high density including the element necessary for setting the analyzing condition shown in FIG. 8A, the mesh with low resolution shown in FIG. 8B stores the vertex necessary for setting the analyzing condition, the ridge line, and the shape mesh.

The method according to the embodiment of the present invention stores the element necessary for setting the analyzing condition and generates the tetrahedral mesh for analysis with high controllability of mesh characteristics.

What is claimed is:

1. A tetrahedral mesh generating method for finite-element analysis executable by a computer, comprising:
   a first step of generating a high-density tetrahedral mesh of a solid model of a product and of adding an identification sign to a mesh element of the high-density tetrahedral mesh, to which an analyzing condition is set; and
   a second step of performing simplification for generating a low-density tetrahedral mesh for finite-element analysis by reducing the number of said high-density tetrahedral meshes generated by said first step, using an edge collapse processing and retaining the mesh element to which the analyzing condition is set,
   wherein said second step comprises:
   calculating a new vertex for integrating vertexes at both end points of a ridge line forming the high-density tetrahedral mesh to one, estimating a possibility to adapt the edge collapse processing for all ridge lines including the ridge line changed by the calculated new vertex, estimating a degree of quality conservation of the tetrahedral mesh when the edge collapse processing is used for an effective ridge line which is estimated the possibility to adapt the edge collapse processing by using the effective ridge line estimated maximum degree of quality conservation of the tetrahedral mesh and a position of the new vertex,
   wherein the possibility to adapt the edge collapse processing is estimated for all ridge line including the ridge line changed by the new vertex to satisfy a parameter for controlling the characteristics of mesh, which is preset for a lower limit $\tau_{ST}$ of the quality of element shape, an upper limit $\tau_{sz}$, of the size, an upper limit $\tau_{TL}$ of an approximation error for shape, and an upper limit $\tau_{VL}$, and
   the degree of quality conservation of the tetrahedral mesh is estimated a quality of element shape of the tetrahedral mesh obtained by using the edge collapse processing on the basis of a stretch $S_t(h)$ of the tetrahedral mesh in following equation having 0.05 or more:

$$S_t(h) = 6\sqrt{6} V_h / (\max_{e \Sigma h} \times S_h)$$

Wherein $V_h$: the volume of the tetrahedral mesh
$S_h$: the surface area of the tetrahedral mesh.

2. A tetrahedral mesh generating method for finite-element analysis according to claim 1, further comprising:
   a third step of executing the finite-element analysis based on said low-density tetrahedral mesh for finite-element analysis generated by said second step and the analyzing condition set, and
   a forth step of revising the parameter for controlling the characteristics of mesh of the second step according to a result of finite-element analysis executed by the third step.

3. A finite-element analyzing apparatus executable by a computer, comprising:
   an analyzing-condition setting unit that captures data on a solid model of a product and sets an analyzing condition;
   a high-density tetrahedral mesh generating unit that captures said analyzing condition and said solid model and adds an identification sign to an element, to which the analyzing condition is set, based on at least a setting element size, to generate a tetrahedral mesh;
   a multi-resolution tetrahedral mesh generating unit that captures the high-density tetrahedral mesh which is generated by said high-density tetrahedral mesh generating unit and to which said identification sign is added, and generates a low-density tetrahedral mesh for analyzing; and
   a finite-element analyzing unit that captures the low-density tetrahedral mesh of multi-resolution for controlling the resolution generated by said multi-resolution tetrahedral mesh generating unit and performs the finite-element analysis by using said analyzing condition; wherein said multi-resolution tetrahedral mesh generating unit performs that calculating a new vertex for integrating vertexes at both end points of a ridge line forming the high-density tetrahedral mesh to one, estimating a possibility to adapt the edge collapse processing for all ridge line including the ridge line changed by the calculated new vertex, estimating a degree of quality conservation of the tetrahedral mesh when the edge collapse processing is used for an effective ridge line which is estimated the possibility to adapt the edge collapse processing, and performing the edge collapse processing by using the effective ridge line estimated maximum degree of quality conservation of the tetrahedral mesh and a position of the new vertex, wherein wherein the possibility to adapt the edge collapse processing is estimated for all ridge line including the ridge line changed by the new vertex to satisfy a parameter for controlling the characteristics of mesh, which is preset for a lower limit $\tau_{ST}$ of the quality of element shape, an upper limit $\tau_{sz}$, of the size, an upper limit $\tau_{VL}$ of an approximation error for shape, and an upper limit $\tau_{VL}$, and the degree of quality conservation of the tetrahedral mesh is estimated a quality of element shape of the tetrahedral mesh obtained by using the edge collapse processing on the basis of a stretch $S_t(h)$ of the tetrahedral mesh in following equation having 0.05 or more:

$$S_t(h) = 6\sqrt{6} V_h / (\max_{e \Sigma h} \times S_h)$$

Wherein $V_h$: the volume of the tetrahedral mesh
$S_h$: the surface area of the tetrahedral mesh.

4. A finite-element analyzing apparatus according to claim 3, further comprising:
   a parameter revising unit for changing the parameter for controlling the characteristics of mesh according to a result of finite-element analysis performed by said finite-element analyzing unit.

* * * * *